United States Patent
Park et al.

(10) Patent No.: US 8,158,447 B2
(45) Date of Patent: Apr. 17, 2012

(54) DUAL PANEL TYPE ORGANIC ELECTROLUMINESCENT DISPLAY DEVICE AND METHOD FABRICATING THE SAME

(75) Inventors: Jae-Hee Park, Daegu (KR); Kyung-Min Park, Gumi-si (KR); Seok-Jong Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/243,227

(22) Filed: Sep. 23, 2011

(65) Prior Publication Data

US 2012/0028387 A1 Feb. 2, 2012

Related U.S. Application Data

(62) Division of application No. 12/883,772, filed on Sep. 16, 2010, now Pat. No. 8,048,699, which is a division of application No. 11/639,301, filed on Dec. 15, 2006, now Pat. No. 7,816,161.

(30) Foreign Application Priority Data

Jun. 29, 2006 (KR) ........................ 10-2006-0059350

(51) Int. Cl.
*H01L 21/21* (2006.01)
*H01L 21/51* (2006.01)

(52) U.S. Cl. ............... 438/34; 438/22; 438/28; 438/29; 438/82; 438/99; 257/E21.002; 257/E21.024; 257/E21.299; 257/E21.527

(58) Field of Classification Search ........... 257/E21.002, 257/E21.024, E21.299, E21.527, E31.095, 257/E51.022
See application file for complete search history.

(56) References Cited

U.S. PATENT DOCUMENTS

| | | | |
|---|---|---|---|
| 6,046,543 A | 4/2000 | Bulovic et al. | |
| 6,699,739 B2 | 3/2004 | Yamazaki et al. | |
| 7,339,567 B2 | 3/2008 | Yasukawa | |
| 7,485,894 B2 * | 2/2009 | Ahn et al. ...................... | 257/40 |
| 7,671,359 B2 | 3/2010 | Suh et al. | |
| 2003/0116772 A1 | 6/2003 | Yamazaki et al. | |
| 2003/0173564 A1 | 9/2003 | Ko et al. | |
| 2006/0060858 A1 * | 3/2006 | Park et al. ...................... | 257/66 |
| 2006/0238462 A1 | 10/2006 | Kim et al. | |
| 2006/0238476 A1 | 10/2006 | Park et al. | |
| 2006/0267490 A1 | 11/2006 | Hong et al. | |
| 2007/0285007 A1 * | 12/2007 | Lee et al. ...................... | 313/504 |

FOREIGN PATENT DOCUMENTS

| | | |
|---|---|---|
| CN | 1327270 | 12/2001 |
| CN | 200410060002 | 2/2005 |
| CN | 1623117 A | 6/2005 |
| JP | 2004-048036 A | 2/2004 |
| JP | 2005-175248 A | 6/2005 |

* cited by examiner

*Primary Examiner* — Mohsen Ahmadi
(74) *Attorney, Agent, or Firm* — McKenna Long & Aldridge, LLP.

(57) ABSTRACT

An organic electroluminescent device includes: a switching element and a driving element connected to each other on a substrate including a pixel region; a planarization layer on the switching element and the driving element, the planarization layer having a substantially flat top surface; a cathode on the planarization layer, the cathode connected to the driving element; an emitting layer on the cathode; and an anode on the emitting layer.

3 Claims, 18 Drawing Sheets

US 8,158,447 B2

DUAL PANEL TYPE ORGANIC ELECTROLUMINESCENT DISPLAY DEVICE AND METHOD FABRICATING THE SAME

This application is divisional of Ser. No. 12/883,772, filed Sep. 16, 2010, now U.S. Pat. No. 8,048,699, which is a divisional of Ser. No. 11/639,301 (now U.S. Pat. No. 7,816, 161), filed Dec. 15, 2006, which claims priority to Korean Patent Application No. 10-2006-0059350, filed Jun. 29, 2006, all of which are incorporated by reference in their entirety for all purposes as if fully set forth herein.

BACKGROUND OF THE INVENTION

1. Field of the Invention

The present invention relates to an organic electroluminescent device (OELD), and more particularly to a top emission type OELD.

2. Discussion of the Related Art

In general, an OELD emits light by injecting electrons from a cathode and holes from an anode into an emission layer, combining the electrons with the holes, generating an exciton, and transitioning the exciton from an excited state to a ground state. In comparison to a liquid crystal display (LCD) device, an additional light source is not necessary for the OELD to emit light, because the transition of the exciton between the two states causes light to be emitted. Accordingly, the size and weight of the OELD are less than the LCD device.

The OELD has other excellent characteristics, such as a low power consumption, superior brightness, and a fast response time. Thus, the OELD is seen as the preferred display for the next-generation of consumer electronic applications such as cellular phones, car navigation systems (CNSs), personal digital assistants (PDAs), camcorders, palmtop computers, etc. Moreover, because fabricating the organic ELD is performed with fewer processing steps, the OELD is less expensive to produce than the LCD device.

In addition, the two types of OELDs are a passive matrix OELD and an active matrix OELD. While both of the passive and active matrix OELDs have a simple structure and are formed by a simple fabricating process, the passive matrix OELD requires a relatively large amount of power to operate. In addition, the display size of the passive matrix OELD is limited by the width and thickness of conductive lines used in the structure. Further, as the number of conductive lines increases, the aperture ratio of the passive matrix OELD decreases. In contrast, the active matrix OELDs are highly efficient and may produce a high-quality image on a large display with a relatively low power.

Turning now to FIG. 1, which is a schematic cross-sectional view of an OELD 1 according to the related art. As shown, the OELD 1 includes first and second substrates 12 and 28 facing and being spaced apart from each other. Also included is an array element layer 14 formed on the first substrate 12. As shown, the array element layer 14 includes a thin film transistor "T." Although not shown, the array element layer 14 further includes a gate line, a data line crossing the gate line to define a pixel region "P," and a power line crossing one of the gate and data lines. In addition, the OELD 1 also includes a first electrode 16 on the array element layer 14, an organic electroluminescent (EL) layer 18 on the first electrode 16, and a second electrode 20 on the organic EL layer 18. In addition, the first electrode 16 is connected to the thin film transistor "T." Here, the organic EL layer 18 includes red (R), green (G) and blue (B) sub-organic EL layers in the pixel regions "P."

In addition, the second substrate 28 functions as an encapsulating panel having a receded portion 21. A desiccant 22 is packaged in the receded portion 21 to protect the OELD 1 from moisture. Further, a seal pattern 26 is formed between the first and second substrates 12 and 28 at a periphery thereof so as to attach the first and second substrates 12 and 28 to each other.

Next, FIG. 2 is an equivalent circuit diagram of the related art ELD shown in FIG. 1. As shown in FIG. 2, a pixel region "P" is defined by a gate line 42 and a data line 44 crossing the gate line 42 formed on a substrate 32. Also included is a power line 55 spaced parallel from the gate line 42 and crossing the data line 44.

In addition, a switching element "$T_S$" is connected to the gate and data lines 42 and 44 in an area adjacent to where the gate and data lines 42 and 44 cross, and a driving element "$T_D$" is connected to the switching element "$T_S$." For example, the driving element "$T_D$" in FIG. 2 is a positive type thin film transistor. Further, a storage capacitor "$C_{ST}$" is formed between the switching element "Ts" and the driving element "$T_D$." Also, a drain electrode 63 of the driving element "$T_D$" is connected to a first electrode (not shown) of an organic EL diode "E." In addition, a source electrode 66 of the driving element "$T_D$" is connected to the power line 55 and a gate electrode 68 is connected to the capacitor Cst and switching element Ts.

Hereinafter, operation of the OELD will be explained in detail. When a gate signal is applied to the gate electrode 46 of the switching element "Ts," a current signal applied to the data line 44 is changed into a voltage signal through the switching element "Ts" and is applied to the gate electrode 68 of the driving element "$T_D$."

Therefore, the driving element "$T_D$" is driven and the level of the current applied to the organic EL diode "E" is determined such that the organic EL diode "E" may display a gray scale. Further, because the signal in the storage capacitor "Cst" functions to maintain the signal of the gate electrode 68 of the driving element "$T_D$," the current applied to the EL diode is maintained until the next signal is applied even if the switching element "Ts" is in an OFF state.

Next, FIG. 3 is a schematic plan view of a related art OELD with respect to one pixel. As shown, the switching element "Ts," the driving element "$T_D$" connected to the switching element "Ts," and the storage capacitor "Cst" are formed on the substrate 32 in the pixel region "P." Alternatively, the switching element "Ts" and the driving element "$T_D$" may be formed in multiple in the pixel region "P" in accordance with an operation characteristic thereof.

In addition, the substrate 32 includes a transparent insulating substrate such as glass or a plastic substrate. The gate line 42 is formed on the substrate 32 and the data line 44 crosses the gate line 42 to define the pixel region "P." In addition, in this example, a power line 55 is parallel to the data line 44.

Further, the switching element "Ts" includes the gate electrode 46 connected to a first gate line 42, a first semiconductor layer 50 over the first gate electrode 46, a first source electrode 56 connected to the data line 44, and a first drain electrode 60 spaced apart from the first source electrode 56. The driving element "$T_D$" includes the second gate electrode 68 connected to the drain electrode 60, a second semiconductor layer 62 over the second gate electrode 68, the second source electrode 66 connected to the power line 55, and the second drain electrode 63. Specifically, the first drain electrode 60 and the gate electrode 68 are connected to each other via a contact hole 64 of an insulating material layer (not shown).

Further, a first electrode 36 is connected to the first drain electrode 63 in the pixel region "P." Although not shown, the storage capacitor "Cst" includes a first storage electrode of doped silicon, a second storage electrode occupying a portion of the power line 55, and an insulating material layer (not shown) between the first and second storage electrodes.

FIG. 4 is a schematic cross-sectional view of the related art OELD taken along the line "IV-IV" in FIG. 3. In FIG. 4, the second semiconductor layer 62 is formed on the substrate 32, a gate insulating layer "GI" is formed on the second semiconductor layer 62, the gate electrode 68 is formed on the gate insulating layer "GI" over the second semiconductor layer 62, and an interlayer insulating layer "IL" is formed on the gate electrode 68 and includes first and second contact holes "C1" and "C2" that expose both end portions of the second semiconductor layer 62. The source and drain electrodes 66 and 63 are formed on the interlayer insulating layer "IL" and are connected to the second semiconductor layer 62 via the first and second contact holes "C1" and "C2."

A passivation layer 67 is also formed on the second source and drain electrodes 66 and 63 and includes a drain contact hole "C3" that exposes a portion of the drain electrode 63. The first electrode 36 is connected to the drain electrode 63 via the drain contact hole "C3," the organic EL layer 38 is formed on the first electrode 36, and a second electrode 80 is formed on the organic EL layer 38. The first electrode 36, the organic EL layer 38, and the second electrode 80 constitute the organic EL diode "E." Further, the driving element "$T_D$" is a negative type TFT, and the first electrode 36 and the second electrode 80 are a cathode and an anode, respectively. Alternatively, the driving element "$T_D$" is a positive type TFT, and the first electrode 36 and the second electrode 80 are an anode and a cathode, respectively.

In addition, the storage capacitor "Cst" and the driving element "$T_D$" are disposed in a row. Here, the source electrode 66 is connected to the second storage electrode, and the first storage electrode 35 is disposed under the second storage electrode 34.

FIG. 5 is a schematic cross-sectional view of an emission region of the related art. In FIG. 5, the emission region of the OELD 1 includes the anode 36 on the substrate 32, a hole injection layer 38a on the anode 36, a hole transport layer 38b on the hole injection layer 38a, an emitting layer 38c on the hole transport layer 38b, an electron transport layer 38d on the emitting layer 38c, an electron injection layer 38e on the electron transport layer 38d, and the cathode 80 on the electron injection layer 38e. These layers are sequentially layered on the anode 36.

In addition, the hole transport layer 38b and the electron transport layer 38d function to transport a hole and electron to the emitting layer 38c to improve an emitting efficiency. Further, the hole injection layer 38c between the anode 36 and the hole transport layer 38b function to reduce a hole injecting energy, and the electron injection layer 38e between the cathode 80 and the electron transport layer 38d function to reduce an electron injecting energy, thereby increasing the emitting efficiency and reducing the driving voltage of the OELD.

Further, the cathode 80 is formed of a material including calcium (Ca), aluminum (Al), aluminum alloy, magnesium (Mg), silver (Ag) and lithium (Li). In addition, the anode 36 includes a transparent conductive material such as indium tin oxide (ITO). Thus, because the anode 36 formed with a transparent conductive material such as ITO is deposited by sputtering, layers under the anode 36 may be damaged. Therefore, to prevent damaging the emitting layer 38, the anode 36 is not formed on the emitting layer 38.

Accordingly, when light from the emitting layer 38 is emitted toward the anode 36 formed under the emitting layer 38, the substantial aperture region is limited due to the array element (not shown) under the anode 36. Consequently, because the OELD related art is a bottom emission type OELD, the brightness deteriorates due to the array element. Further, to minimize the aperture region, the design of the array element is limited. Also, the driving element is selected from a positive type poly-silicon type in connection with the structure of the organic EL diode, the array process is complicated and the product yield is reduced.

SUMMARY OF THE INVENTION

Accordingly, the present invention is directed to a duel panel type organic electroluminescent display device and method of fabricating the same that substantially obviates one or more of the problems due to limitations and disadvantages of the related art.

An advantage of the present invention is to address the above-noted and other problems.

Another advantage of the present invention is to provide an OELD and a method of fabricating the same that may be driven as a top emission type OELD with an improved brightness.

Another advantage of the present invention is to provide an OELD and a method of fabricating the same that includes an array element formed through a simple process that reduces the product cost.

Another advantage of the present invention is to provide an OELD and a method of fabricating the same that may prevent a division between an emitting layer due to a step difference on the array element.

Another advantage of the present invention is to provide an OELD and a method of fabricating the same that may prevent shorting of an anode and a cathode by a damage of the emitting layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes: a switching element and a driving element connected to each other on a substrate including a pixel region; a planarization layer on the switching element and the driving element, the planarization layer having a substantially flat top surface; a cathode on the planarization layer, the cathode connected to the driving element; an emitting layer on the cathode; and an anode on the emitting layer.

In another aspect of the present invention, a method of fabricating an organic electroluminescent device includes: forming a switching element and a driving element connected to each other on a substrate including a pixel region; forming a planarization layer on the switching element and the driving element, the planarization layer having a substantially flat top surface; forming a cathode on the planarization layer, the cathode connected to the driving element; forming an emitting layer on the cathode; and forming an anode on the emitting layer.

In another aspect of the present invention, a method of fabricating an organic electroluminescent device includes: forming a gate line and a power line spaced apart from each other on a substrate; forming a gate insulating layer on the gate line and the power line; forming a data line on the gate insulating layer, the data line crossing the gate line; forming a switching element connected to the gate and data line, and a driving element connected to the switching element, the switching element including a first gate electrode, a first semiconductor layer, a first source electrode, and a first drain electrode, the driving element including a second gate electrode, a second semiconductor layer, a second source electrode, and a second drain electrode; forming a planarization layer on the switching element and the driving element; etching the planarization layer to form a drain contact hole that exposes a portion of the second drain electrode; forming a cathode on the planarization layer, the cathode connected to the second drain electrode via the drain contact hole; forming an emitting layer on the cathode; and forming an anode on the emitting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment, examples of which are illustrated in the accompanying drawings.

Figure 1:
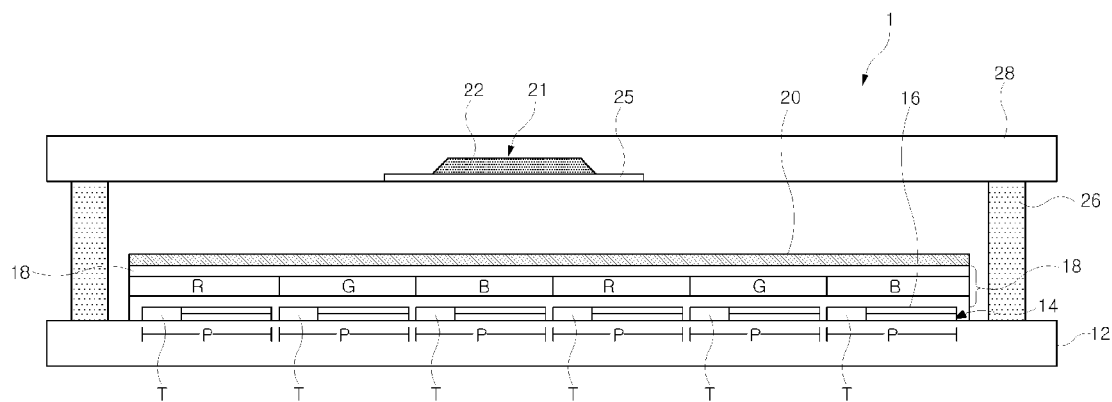
FIG. 1 is a schematic cross-sectional view of a related art OELD.
Figure 2:
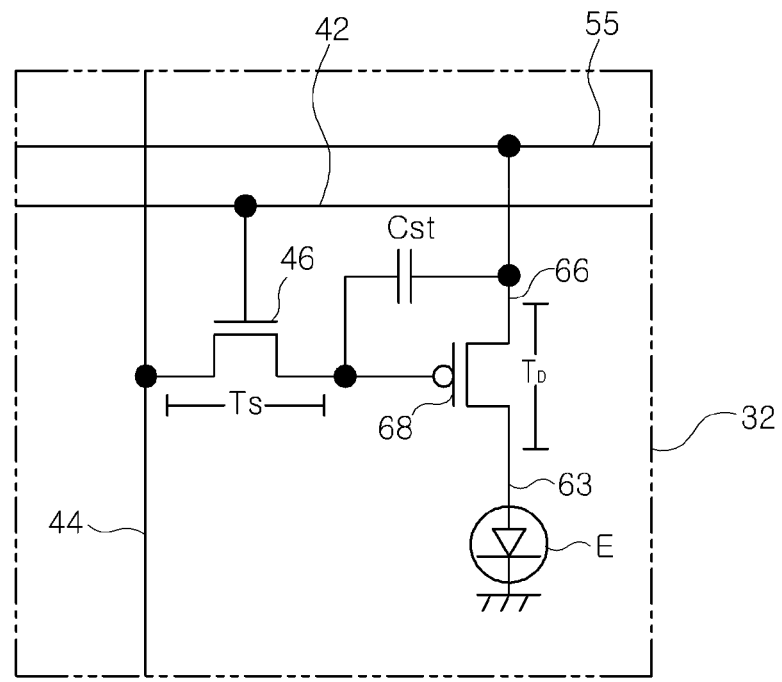
FIG. 2 is an equivalent circuit diagram of the related art OELD.
Figure 3:
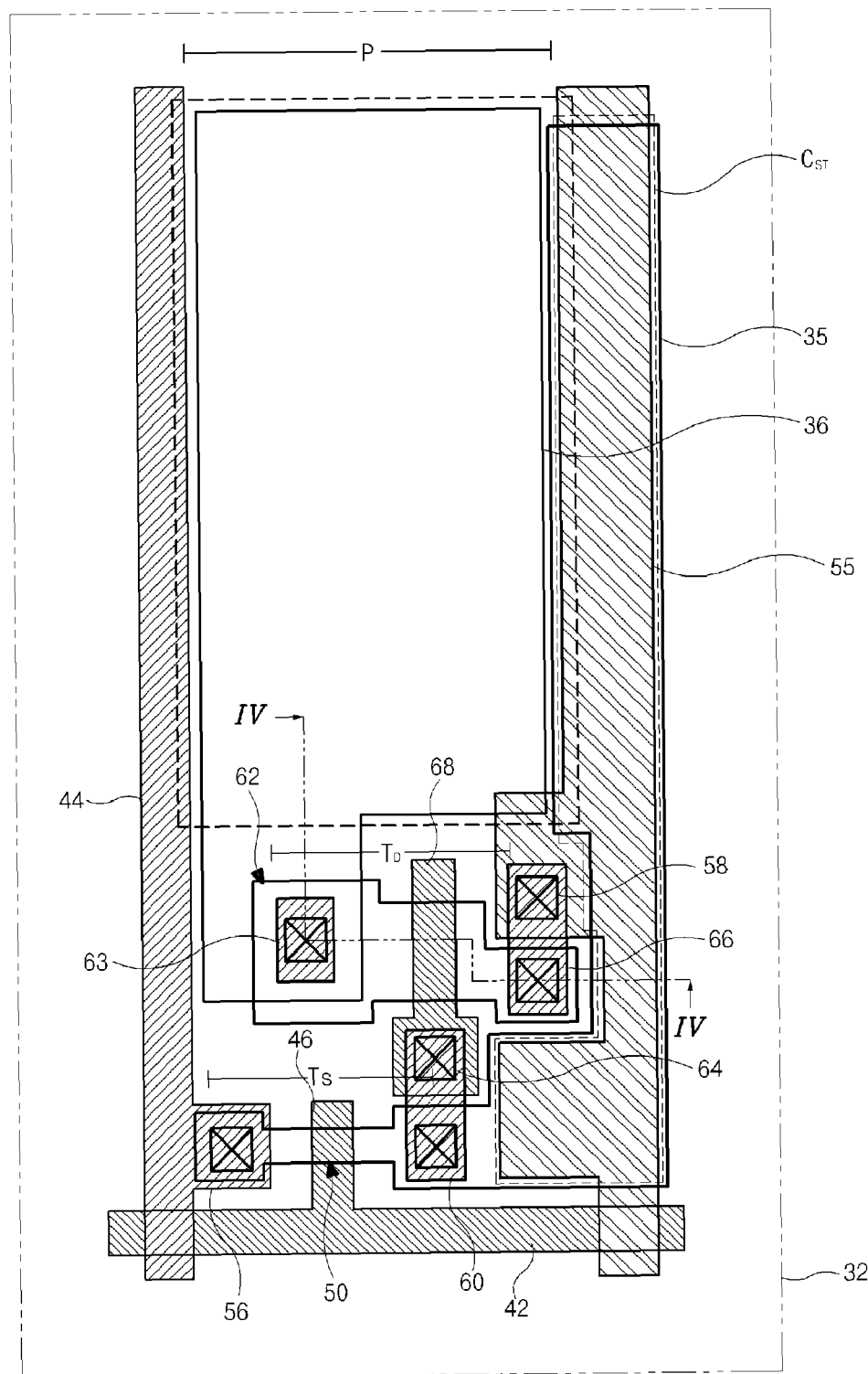
FIG. 3 is a schematic plan view of the related art OELD with a respect to one pixel region.
Figure 4:
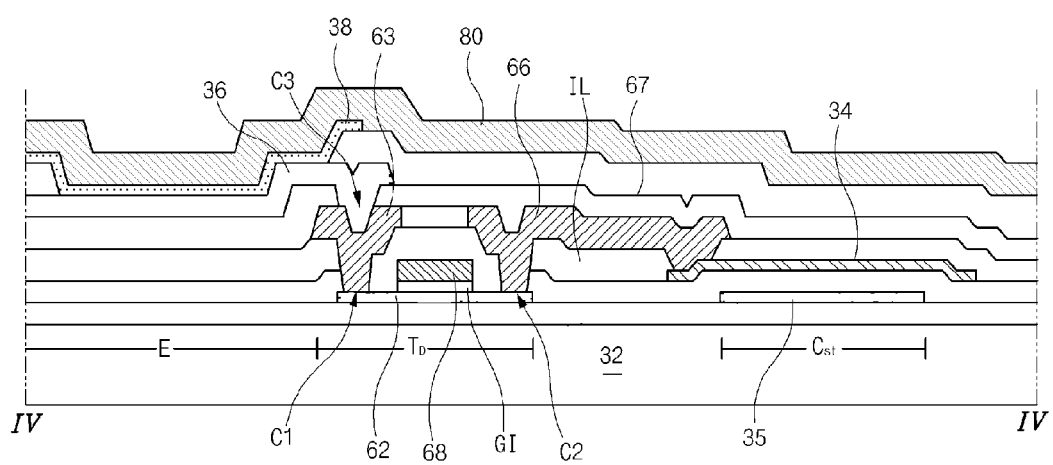
FIG. 4 is a schematic cross-sectional view of the related art OELD taken along the line "IV-IV" in FIG. 3.
Figure 5:
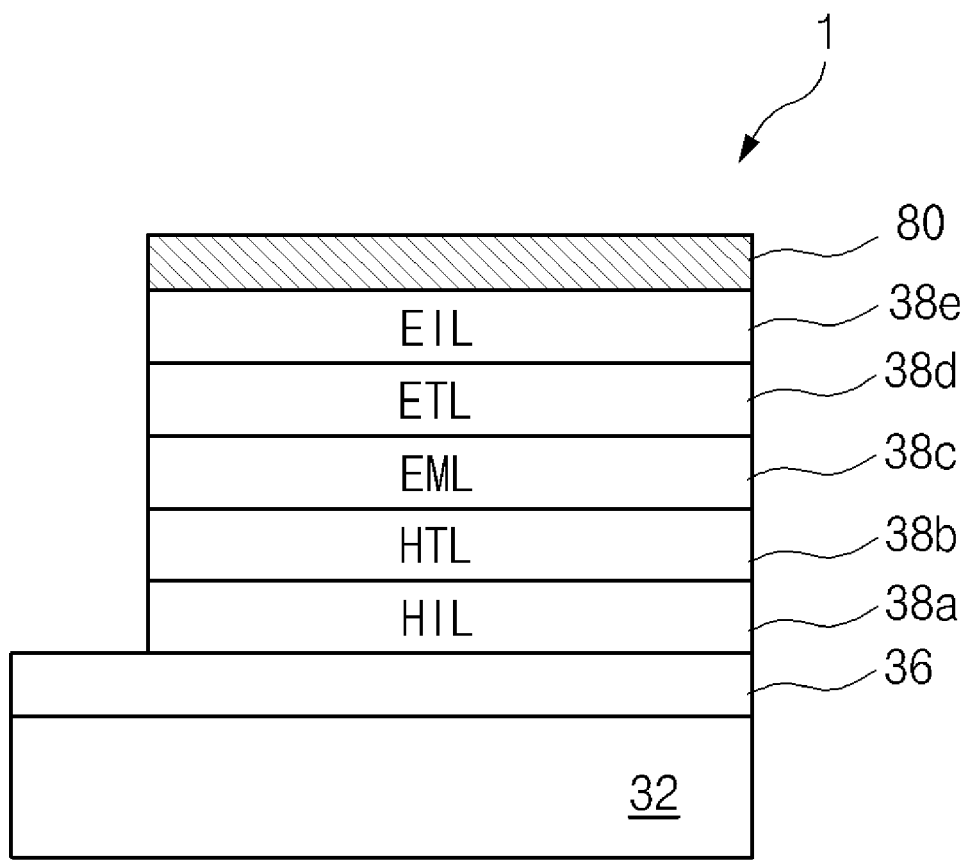
FIG. 5 is a schematic cross-sectional view of an emission region of the related art OELD.
Figure 6:
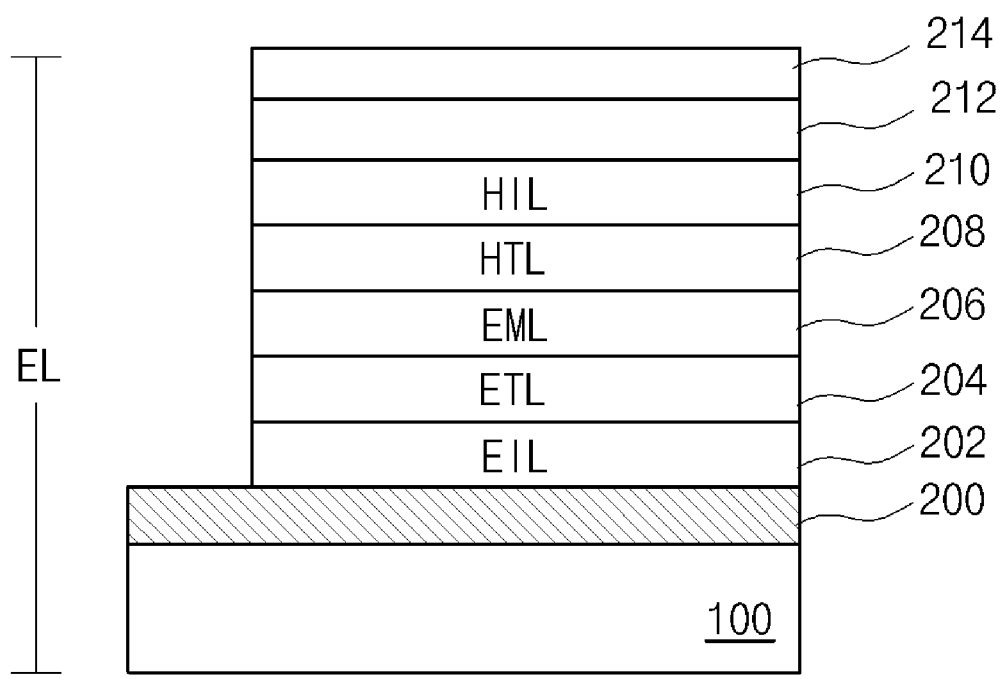
FIG. 6 is a schematic cross-sectional view of an OELD according to an embodiment of the present invention.

FIG. 6 is a schematic cross-sectional view of an OELD according to an embodiment of the present invention. As shown in FIG. 6, the OELD "EL" includes an array element (not shown) on a substrate 100, a cathode 200 on the array element, an electron injection layer 202 on the cathode 200, an electron transport layer 204 on the electron injection layer 202, an emitting layer 206 on the electron transport layer 204, a hole transport layer 208 on the emitting layer 206, a hole injection layer 210 on the hole transport layer 208, and an anode 214 over the hole injection layer 210.

Further, a buffer layer 212 may be disposed between the hole injection layer 210 and the anode 214 to prevent damage to the hole injection layer 210 during a deposition process by sputtering of the anode 214 of ITO or IZO. For example, the buffer layer 212 may include an organic molecular material for the hole injection layer. Specifically, the buffer layer 212 may be selected from one of an organic monomolecular material having a crystallinity and an oxide including vanadium pentoxide ($V_2O_5$). Also, the organic monomolecular material includes copper phthalocyanine (CuPc). Specifically, CuPc can be formed with a thin thickness and have a low threshold voltage and a high mobility.

In addition, the anode 214 includes a transparent conductive material such as ITO or IZO, and the cathode 200 includes molybdenum (Mo). Generally, although the cathode 200 is selected from a metallic material having a low work function such as calcium (Ca), aluminum (Al), aluminum alloy, magnesium (Mg), silver (Ag), or lithium (Li), the metallic material having a low work function is easily oxidized by being exposed to moisture and air during the mask process. Accordingly, the cathode 200 includes Mo having a non-oxidation characteristic or may further include a buffer layer between the cathode 200 and the electron injection layer 202. Specifically, the buffer layer may be etched when patterning a passivation layer (not shown) on the buffer layer to connect the cathode 200 and a drain electrode of the driving element "$T_D$."

As explained above, because the anode 214 is formed on top of the OELD, the OELD is a top emission type, thereby improving an aperture ratio. Also, although not shown, the cathode 200 is connected to a drain electrode of a driving element that is a negative type TFT, thereby reducing the number of manufacturing processing steps and thus the product cost. Furthermore, because the oxidation of the cathode 200 is prevented, process defects are prevented.

It is noted that a planarization layer (not shown) is disposed under the cathode 200 to planarizing a step difference on a surface of the array element.

Figure 7:
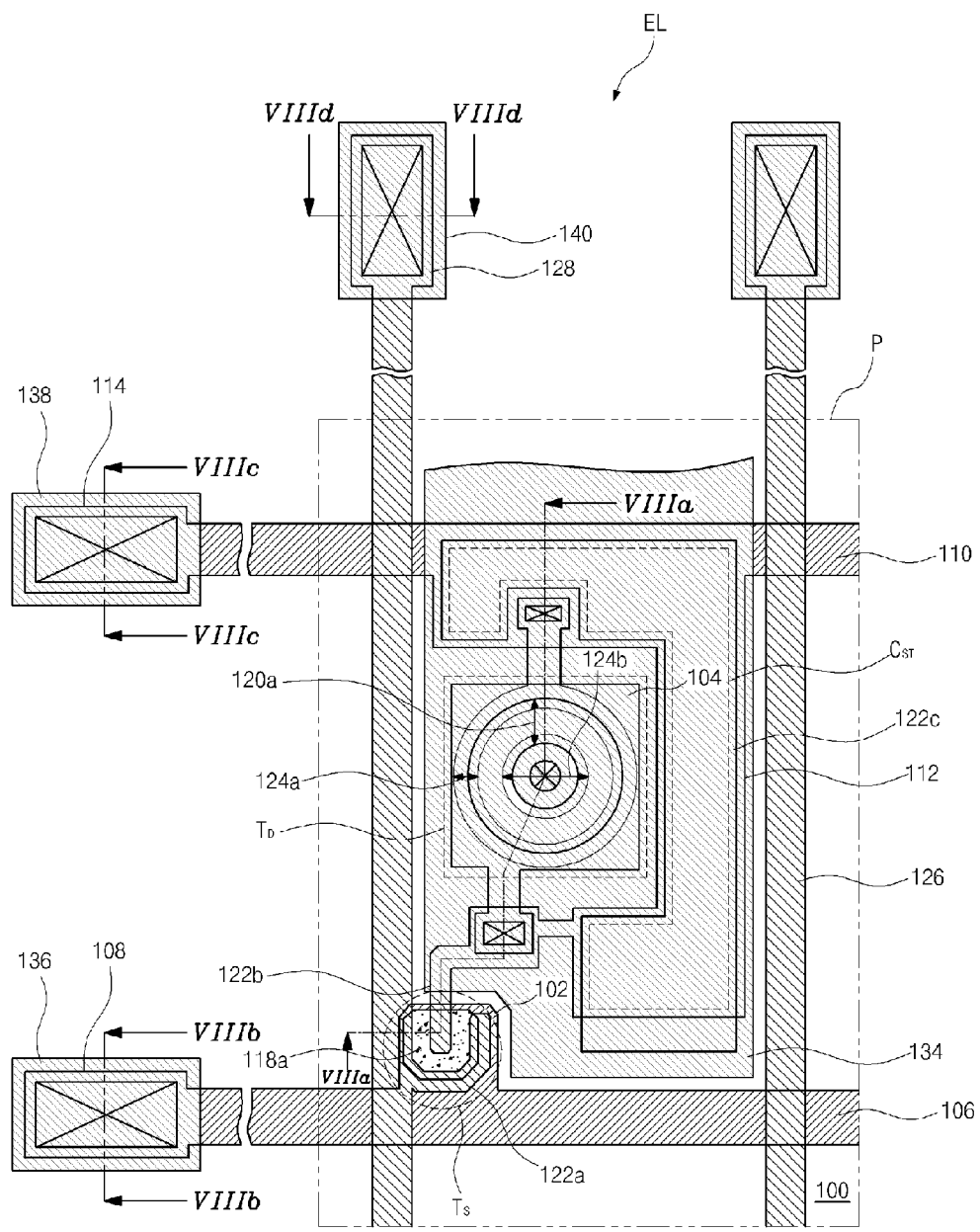
FIG. 7 is a schematic plan view of an array substrate of an OELD "EL" according to an embodiment of the present invention.

Next, FIG. 7 is a schematic plan view of an array substrate of an OELD "EL" according to an embodiment of the present invention. In FIG. 7, the switching element "Ts" and the driving element "$T_D$," connected the switching element "Ts" are formed on the substrate 100 in a pixel region "P."

The switching element "Ts" may be a negative thin film transistor including a first gate electrode 102, a first semiconductor layer 118, a first source electrode 122a, and a first drain electrode 122b. In addition, the driving element "$T_D$" is a negative thin film transistor including a second gate electrode 104, a second semiconductor layer 120, a second source electrode 124a and a second drain electrode 124b. Specifically, the driving element "$T_D$" is connected to the switching element "Ts" by connecting the second gate electrode 104 to the first drain electrode 122b.

The first semiconductor and second semiconductor layers 118 and 120 include amorphous silicon, and the switching element "Ts" and the driving element "$T_D$" are formed in a structure to improve an operation characteristic of the OELD. For example, the first source electrode 122a has a "U" shape and the first drain electrode 122b has a bar shape extending into the first source electrode 122a and being spaced apart from the electrode 122a. Also, the second source electrode 124a has a ring shape and the second drain electrode 124b has a circular shape contained within and separated from the second source electrode 124a.

By the channel structures of the switching element "Ts" and the driving element "$T_D$," the channel length (not shown) is reduced and the channel width (not shown) is increased, thereby maximizing the channel width and minimizing the thermallization of the OELD.

In addition, a gate line 106 is formed on the substrate 100 along a first direction and is connected to the first gate electrode 102 to apply a scanning signal to the first gate electrode 102. A data line 126 crosses the gate line 106 to define the pixel region "P" and is connected to the first source electrode 122a to apply a data signal to the first source electrode 122a. In addition, a power line 110 is parallel to and is spaced apart from the gate line 106.

Further, a gate pad 108, a data pad 128 and a power pad 114 are formed at end portions of the gate line 106, the data line 126 and the power line 110, respectively. Furthermore, a gate pad terminal 136, a data pad terminal 140 and a power pad terminal 138 are connected to the gate pad 108, the data pad 128 and the power pad 114, respectively. For example, the gate pad terminal 136, the data pad terminal 140 and the power pad terminal 138 include a transparent conductive material such as indium tin oxide (ITO) or indium zinc oxide (IZO).

Meanwhile, although not shown, a storage capacitor "Cst" includes a first storage electrode extending from the first drain electrode 122b, a second storage electrode extending from the power line 110, and an insulating layer between the first storage electrode and the second storage electrode. In other words, the first storage electrode, the insulating layer and the second storage electrode are sequentially layered.

In addition, a cathode 134 as a first electrode is connected to the second drain electrode 124b. Although not shown, an emitting layer (not shown) is formed on the cathode 134 and an anode (not shown) is formed as a second electrode on the emitting layer.

Here, the first semiconductor and second semiconductor layers 118 and 120 include amorphous silicon, and the switching element "Ts" and the driving element "$T_D$" are formed in a structure to improve an operation characteristic of the OELD. For example, the first source electrode 122a has a "U" shape and the first drain electrode 122b has a bar shape extending into the first source electrode 122a spaced apart from the electrode 122a. Also, the second source electrode 124a has a ring shape and the second drain electrode 124b has a circular shape contained within and separated from the second source electrode 124a.

By the channel structures of the switching element "Ts" and the driving element "$T_D$," the channel length (not shown) is reduced and the channel width (not shown) is increased, thereby maximizing the channel width and minimizing the thermallization of the OELD.

Figure 8A:
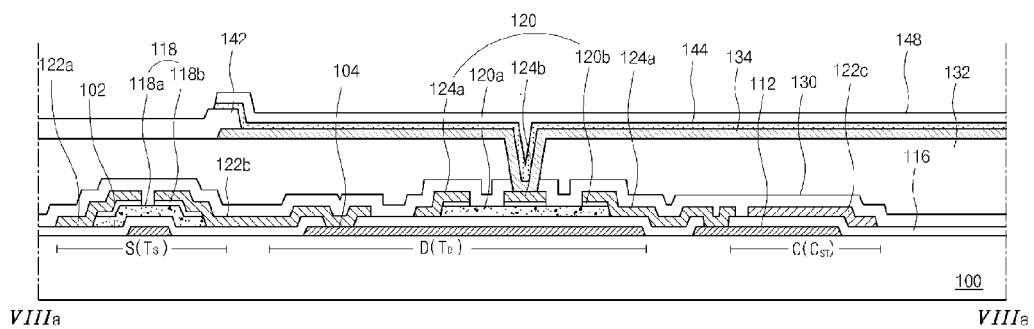
FIGS. 8A to 8D are schematic cross-sectional views of an organic ELD taken along lines "VIIIa-VIIIa," "VIIIb-VIIIb," "VIIIc-VIIIc," and "VIIId-VIIId" of FIG. 7 according to an embodiment of the present invention.
Figure 8B:
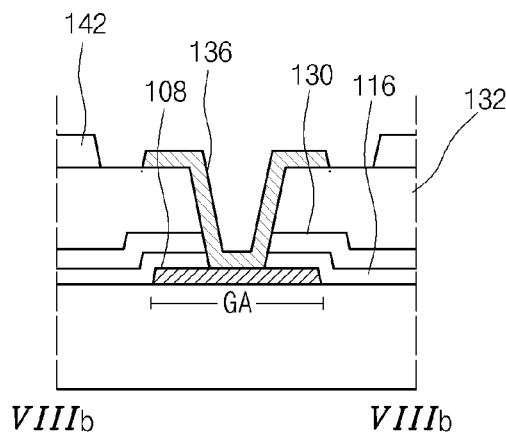
Figure 8C:
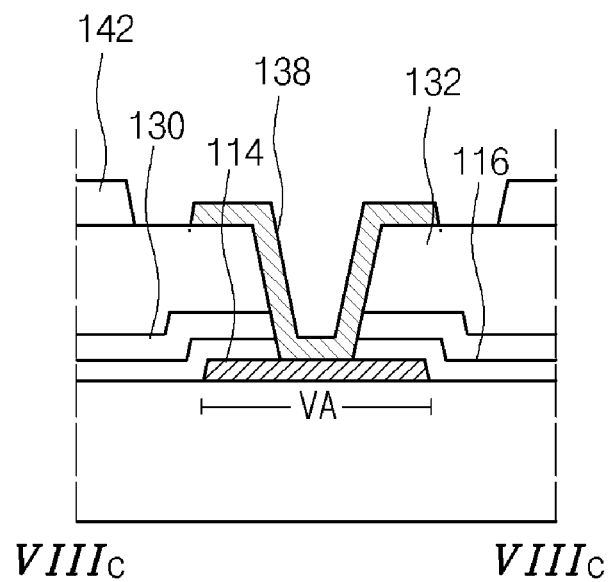
Figure 8D:
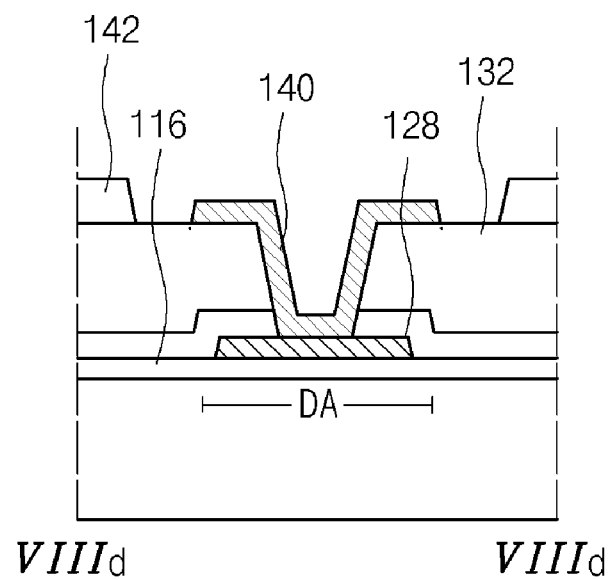

Next, FIGS. 8A, 8B, 8C and 8D are schematic cross-sectional views of an organic ELD taken along lines "VIIIa-VIIIa," "VIIIb-VIIIb," "VIIIc-VIIIc," and "VIIId-VIIId" of FIG. 7 according to an embodiment of the present invention. In more detail, FIG. 8A illustrates a switching region "S," a driving region "D" and a storage region "C" defined on the substrate 100. FIGS. 8B, 8C and 8D illustrate a gate region "GA," a power region "VA" parallel to the gate region "GA," and a data region "DA" perpendicular to the gate region "GA" and the power region "VA," respectively.

As shown in FIG. 8A, the switching element "Ts" and the driving element "$T_D$" connected to the switching element "Ts" are formed in the switching region "S" and the driving region "D," respectively. Further, as discussed above with respect to FIG. 7 and as shown in FIG. 8A, the switching element "Ts" includes the first gate electrode 102, the first semiconductor layer 118, the first source electrode 122a, and the first drain electrode 122b. Further, the driving element "$T_D$" includes the second gate electrode 104, the second semiconductor layer 120, the second source electrode 124a, and the second drain electrode 124b. As shown in FIG. 7, the gate line 106 is formed along a first direction on the substrate 100, the power line 110 is parallel to and is spaced apart from the gate line 106, and the data line 126 crosses the gate line 106 to define the pixel region "P."

In the storage region "C" (not shown), a first storage electrode extends from the first drain electrode 122b, and a second storage electrode extends from the power line 110. Further, a gate insulating layer 116 is disposed on the first storage electrode. In addition, as shown in FIG. 8A, the cathode 134 is connected to the second drain electrode 124b, an emitting layer 144 is formed on the cathode 134, and an anode 148 is formed on the emitting layer 144. In addition, the cathode 134 includes an opaque metallic material and the anode 148 includes a transparent conductive material. That is, the OELD "EL" is driven as a top emission type device such that light from the emitting layer 144 is transmitted toward the anode 148.

Also, the second gate electrode 104 is connected to the first drain electrode 122b via a contact hole of the gate insulating layer 116, and the second source electrode 124a is connected to the power line 110 (shown in FIG. 7). Furthermore, a first passivation layer 142 is formed on the cathode 134 at a boundary between the pixel regions "P," so the emitting layer 144 in each pixel region "P" is prevented from contacting each other.

Further, as shown in FIG. 7, the gate pad 108, the data pad 128 and the power pad 114 are formed at the end of the gate line 106, the data line 126 and the power line 110, respectively. In addition, the gate pad terminal 136, the data pad terminal 140 and the power pad terminal 138 are connected to the gate pad 108, the data pad 128 and the power pad 114, respectively. FIGS. 8B, 8C and 8D illustrate in cross-sectional views the gate pad 108, the power pad 114, and the data pad 128, respectively.

Further, a second passivation layer 130 is formed on the switching element "Ts," the driving element "$T_D$" and the storage capacitor "$C_{ST}$." For example, the second passivation layer 130 includes an insulating inorganic material such as silicon oxide (SiOx) or silicon nitride (SiNx).

It is noted that a planarization layer 132 is formed between the second passivation layer 130 and the cathode 134 to prevent the problem where the emitting layer 144 has a gap at the step difference on the array element, shorting of electrodes occurs, or dark spot occurs due to thermallization of the emitting layer 144.

FIGS. 9A to 9E, 10A to 10E, 11A to 11E and 12A to 12E, which are schematic cross-sectional views in accordance with a fabricating process of an OELD taken along lines "VIIIa-VIIIa", "VIIIb-VIIIb", "VIIIc-VIIIc" and "VIIId-VIIId" in FIG. 7 according to an embodiment of the present invention. FIG. 7 will also be referred to in this description.

Figure 9A:
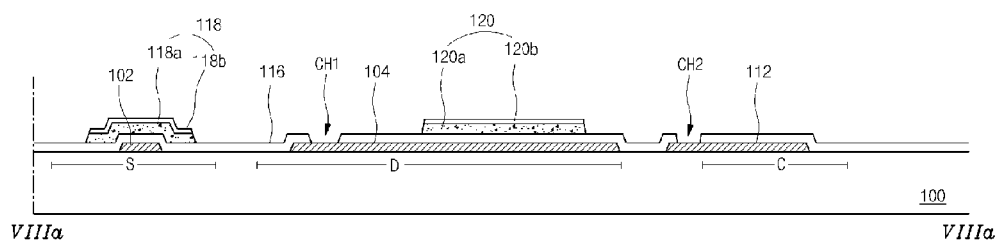
FIGS. 9A to 9E, 10A to 10E, 11A to 11E and 12A to 12E, which are schematic cross-sectional views in accordance with a fabricating process of an OELD taken along lines "VIIIa-VIIIa", "VIIIb-VIIIb", "VIIIc-VIIIc" and "VIIId-VIIId" in FIG. 7 according to an embodiment of the present invention.
Figure 10A:
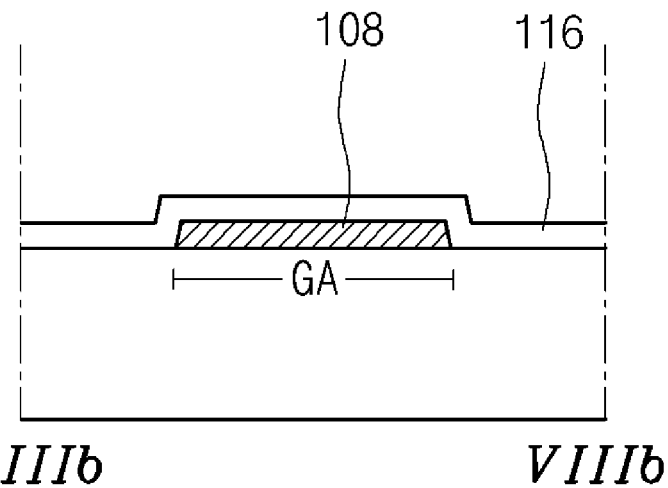
Figure 10B:
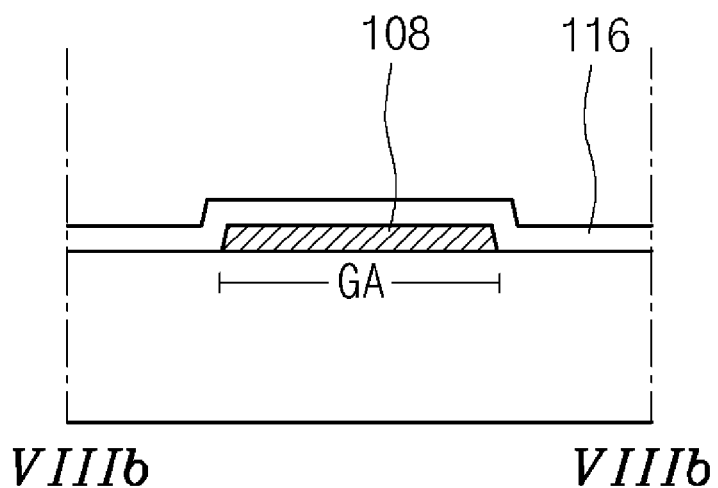
Figure 10C:
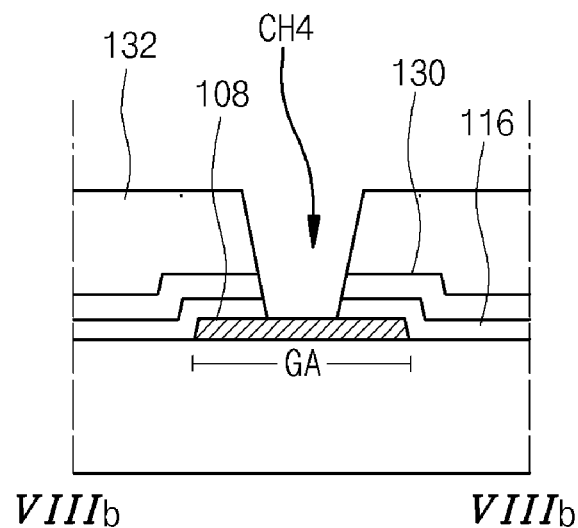
Figure 10D:
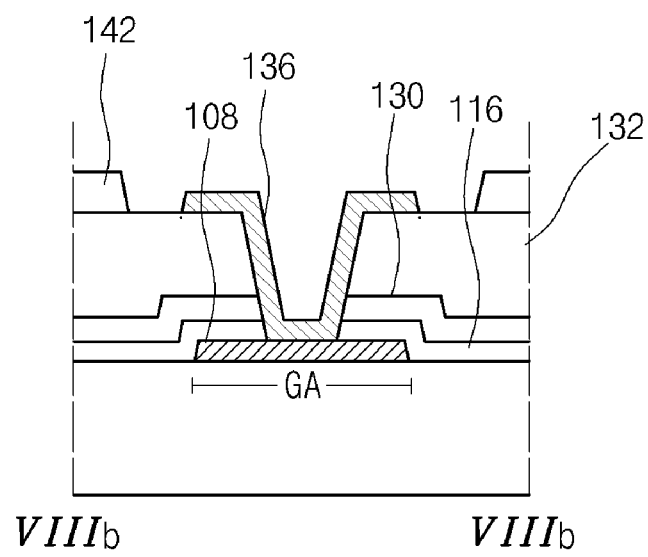
Figure 10E:
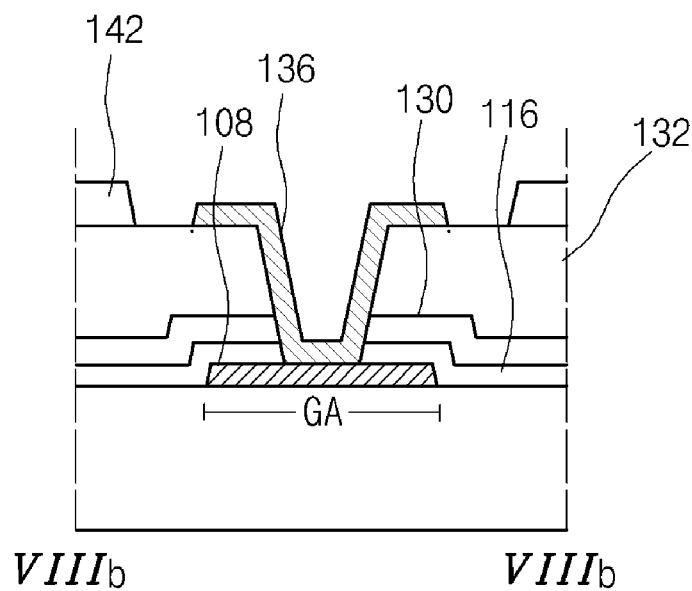
Figure 11A:
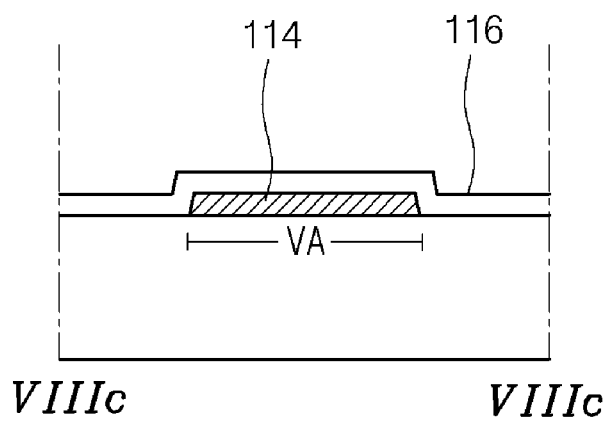
Figure 11B:
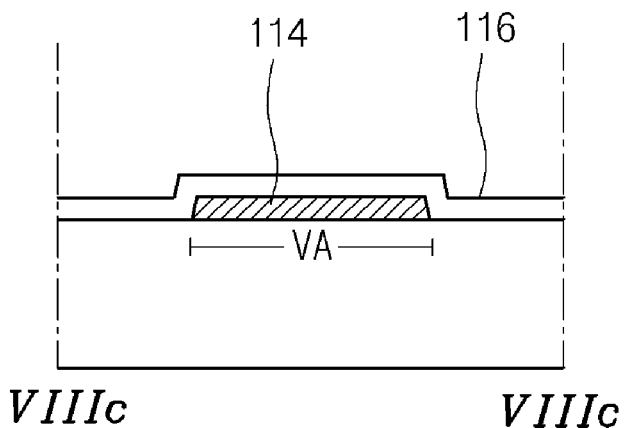
Figure 11C:
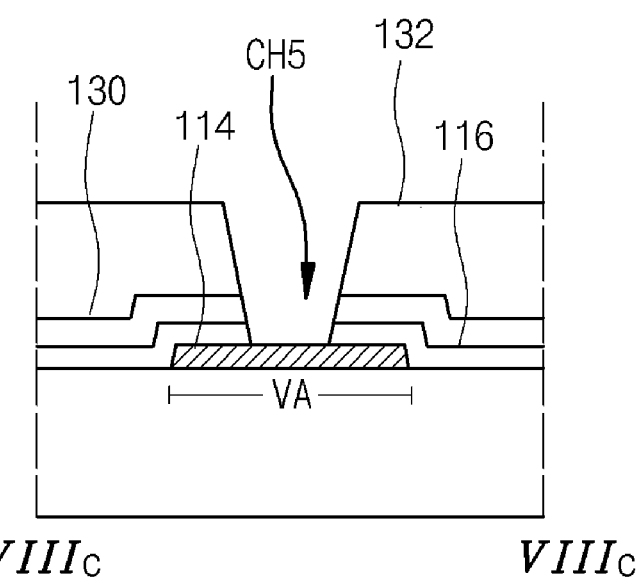
Figure 11D:
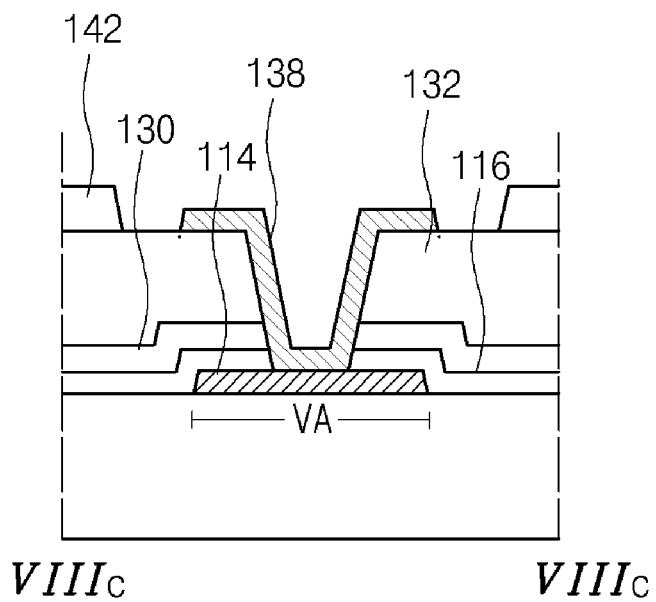
Figure 11E:
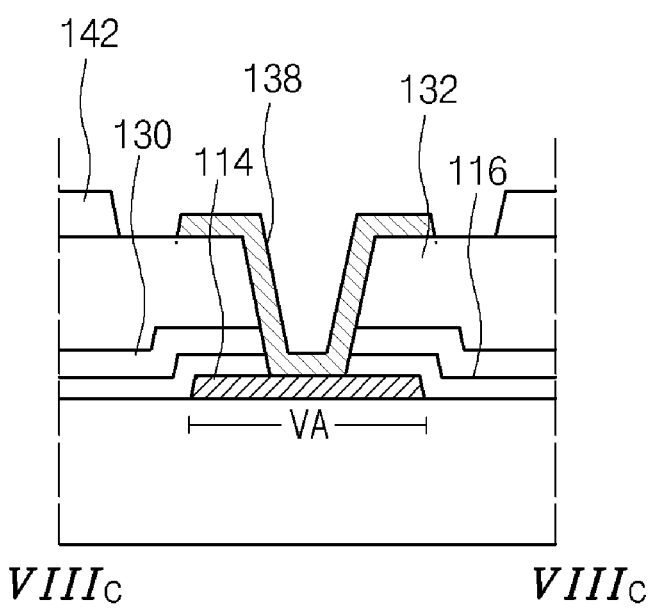
Figure 12A:
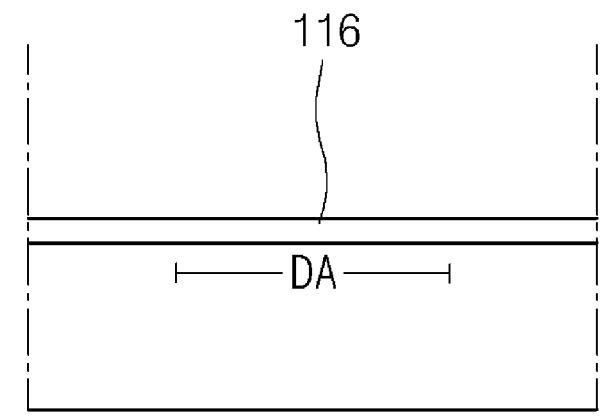
Figure 12B:
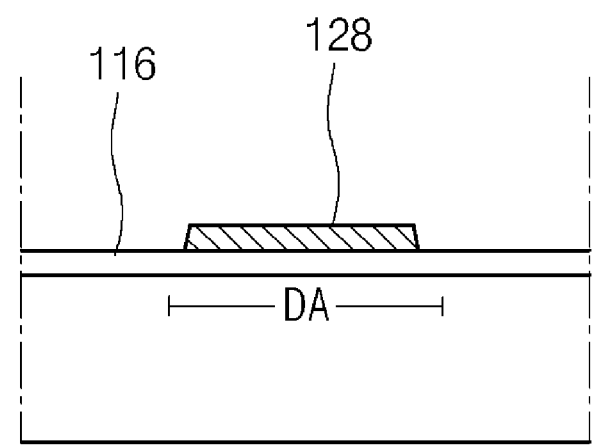
Figure 12C:
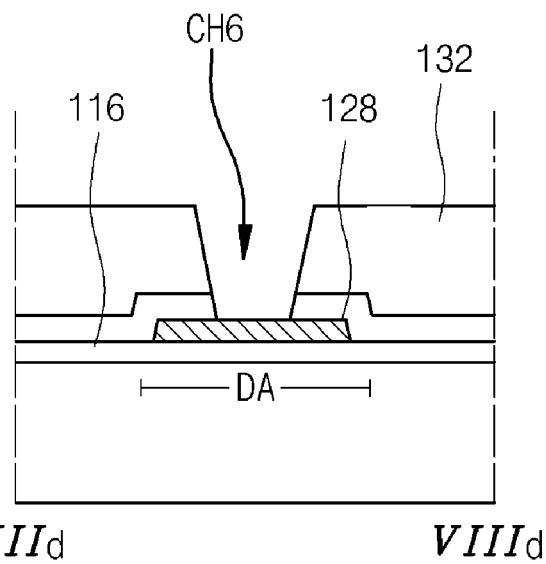
Figure 12D:
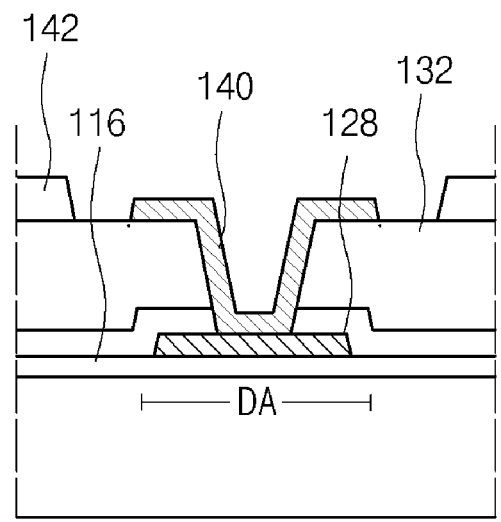
Figure 12E:
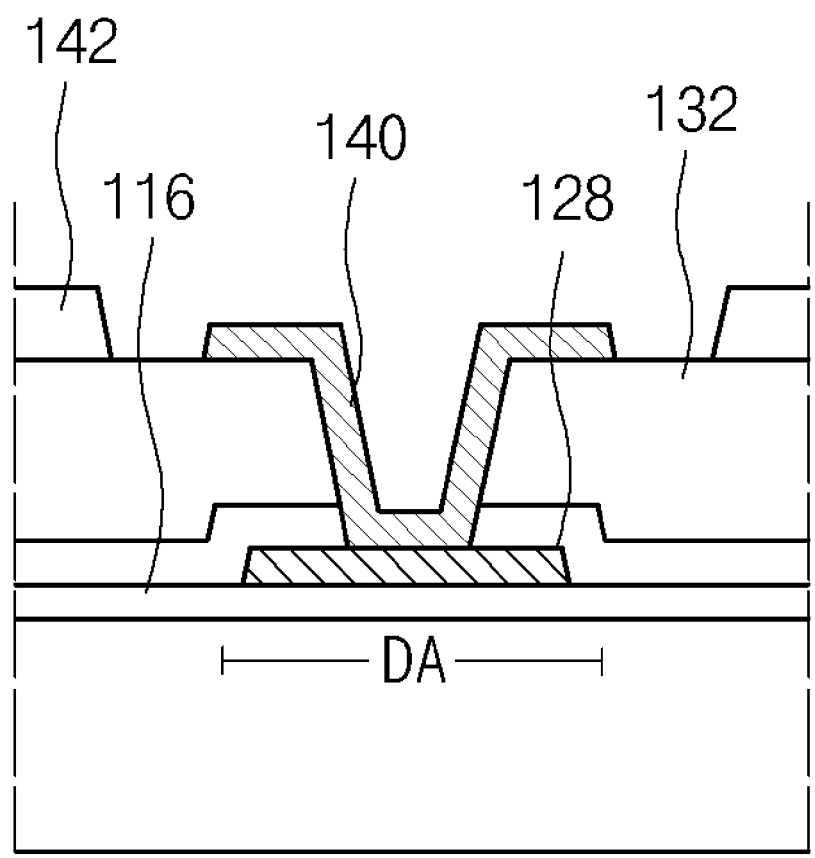

As shown in FIGS. 7 and 9A, the pixel region "P," the switching region "S," the driving region "D," and the storage region "C" are formed on the substrate 100. FIGS. 10A, 11A, and 12A illustrate the gate region "GA," the power region "VA," and the data region "DA," respectively. The data region "DA" and the gate region "GA" define the pixel region "P", and the power region "VA" is disposed at a region parallel to the gate region "GA." Further, as shown in FIG. 9A, the first and second gate electrodes 102 and 104 are formed by depositing and patterning a material including aluminum (Al), aluminum alloy such as aluminum neodymium (AlNd), chromium (Cr), Mo, copper (Cu), and titanium (Ti) in the switching region "S" and the driving region "D," respectively. In the gate region "GA," as shown in FIG. 7, the gate line 106 is connected to the first gate electrode 102 and is formed on the substrate 100, and the gate pad 108 is formed at end portion of the gate line 106. Further, the power line 110 is formed in the power region "VA," and the power pad 114 is formed at an end portion of the power line 110. The first storage electrode 112 extending from the power line 110 is formed in the storage region "C."

Next, as shown in FIGS. 9A, 10A, 11A and 12A, the gate insulating layer 116 is formed by depositing an inorganic insulating material such as silicon nitride (SiNx) or silicon oxide (SiOx) on the first gate electrode 102, the second gate electrode 104 and the second storage electrode 112. See also FIGS. 10B, 11B and 11C.

Next, first active and second active layers 118a and 120a are formed by depositing an intrinsic amorphous silicon on the gate insulating layer 116 in the switching region "S" and the driving region "D," respectively. Sequentially, first and second ohmic contact layers 118b and 120b are formed by depositing doped amorphous silicon on the first active and second active layers 118a and 120a, respectively. Here, the first active layer 118a and the first ohmic contact layer 118b constitute a first semiconductor layer 118, and the second active layer 120a and the second ohmic contact layer 120b constitute a second semiconductor layer 120.

Figure 9B:
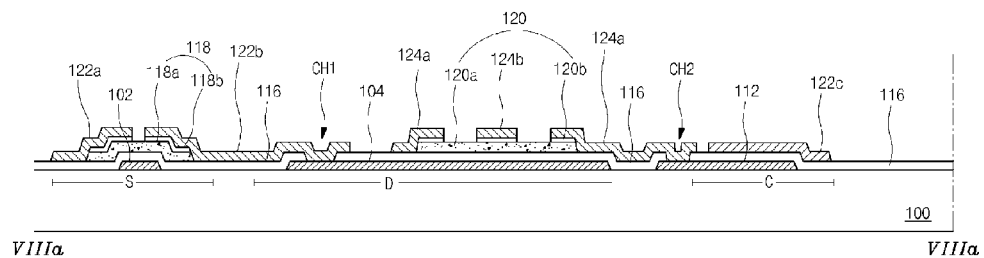

Next, as shown in FIG. 9A, first and second contact holes "CH1" "CH2" are formed by etching the gate insulating layer 116 to expose a portion of the second gate electrode 104 and a portion of the first storage electrode 112. As shown in FIG. 9B, the first source and first drain electrodes 122a and 122b, the second source and second drain electrodes 124a and 124b, and the data line 126 (of FIG. 7) are formed by depositing a conductive metallic material such as the same material as the gate line 106 in the switching region "S," the driving region "D" and the storage region "C," respectively. Further, the second storage electrode 122c extends from the first drain electrode 122b, the second gate electrode 104 is connected to the first drain electrode 122b via the first contact hole "CH1," and the second drain electrode 124b is connected to the second storage electrode 122c via the second contact hole "CH2."

Next, a portion of the first ohmic contact layer 118b between the first source electrode 122a and the first drain electrode 122b is removed to expose a portion of the first active layer 118a corresponding to the portion of the first ohmic contact layer 118b. Further, a portion of the second ohmic contact layer 120b between the second source electrode 124a and the second drain electrode 124b is removed to expose a portion of the second active layer 120a corresponding to the portion of the second ohmic contact layer 120b. Here, the exposed first active and second active layers 118a and 120a function as an active channel (not shown). In addition, as shown in FIG. 7, to reduce a channel length and to increase a channel width, the first source electrode 122a may have "U" shape and the first drain electrode 122b may be a bar shape. Alternatively, the second source electrode 124a may have a ring shape and the second drain electrode 124b may have a circular shape.

In addition, the first gate electrode 102, the first semiconductor layer 118, the first source electrode 122a, and the first drain electrode 122b constitute the switching element "Ts." Also, the second gate electrode 104, the second semiconductor layer 120, the second source electrode 124a, and the second drain electrode 124b constitute the driving element "$T_D$."

Figure 9C:
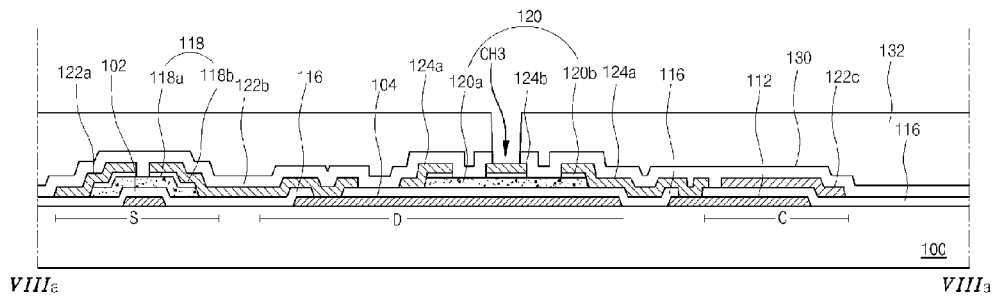

Next in FIG. 9C, the first passivation layer 130 is formed by depositing an inorganic insulating material on the switching element "Ts" and the driving element "$T_D$." Next, a planarization layer 132 is formed by coating an insulating organic material such as benzocyclobutene (BCB) or acrylic resin on the first passivation layer 130.

In this step, a third contact hole "CH3" is formed by etching the first passivation layer 130 and the planarization layer 132 to expose a portion of the second drain electrode 124b. Simultaneously, fourth, fifth and sixth contact holes "CH4," "CH5," and "CH6" are formed by etching the first passivation layer 130 and the planarization layer 132 to expose portions of the gate pad 108, the power pad 114, and the data pad 128, respectively (see also FIGS. 10C, 11C and 12C).

Figure 9D:
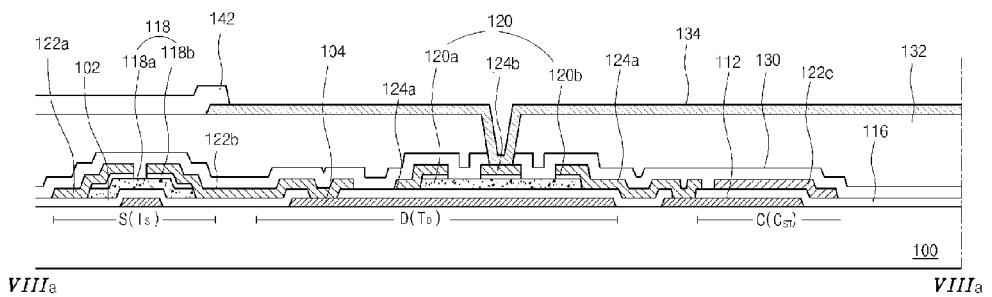

In FIG. 9D, the cathode 134 is formed by depositing one of calcium (Ca), aluminum (Al), aluminum alloy, magnesium (Mg), silver (Ag), and lithium (Li) on the driving element "$T_D$." Specifically, the cathode 134 is connected to the second drain electrode 124b via the third contact hole "CH3." In this step, the gate pad terminal 136, the power pad terminal 138, and the data pad terminal 140 are formed using the same material as that of the cathode 134.

In this step, the gate pad terminal 136, the power pad terminal 138, and the data pad terminal 140 are connected to the gate pad 108, the power pad 114 and the data pad 128 via the fourth contact hole "CH4," the fifth contact hole "CH5" and the sixth contact hole "CH6," respectively.

Next, the second passivation layer 142 is formed on the cathode 134, the gate pad terminal 136, the power pad terminal 138, and the data pad terminal 140. The second passivation layer 142 is etched to expose the cathode 134, the gate pad terminal 136, the power pad terminal 138, and the data pad terminal 140. In other words, the second passivation layer 142 remains at the peripheries of the cathode 132, the gate pad terminal 136, the power pad terminal 138, and the data pad terminal 140.

Figure 9E:
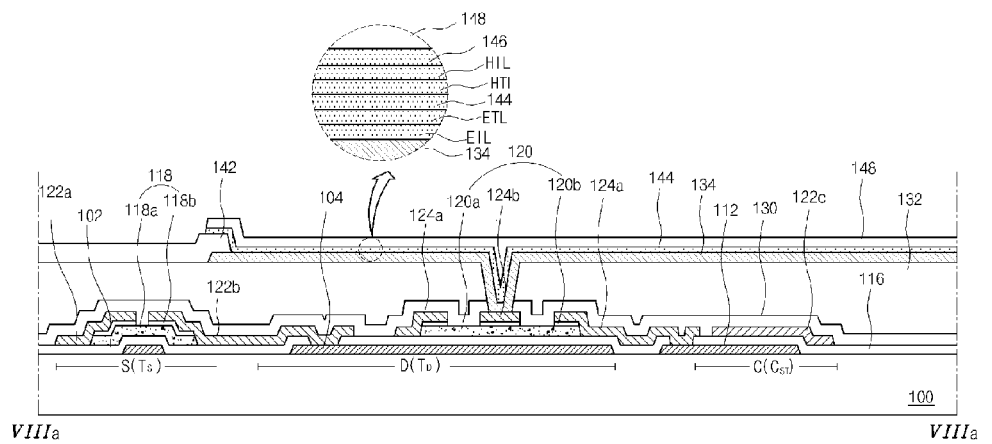

Next, in FIGS. 9E, 10E, 11E and 12E, the emitting layer 144 is formed over the cathode 132. Further, as shown in FIG. 9E, the OELD includes the electron injection layer "EIL" on the cathode 134, the electron transport layer "ETL" on the electron injection layer "EIL," the hole transport layer "HTL" on the emitting layer 144, the hole injection layer "HIL" on the hole transport layer "HTL," and the buffer layer 146 on the hole the injection layer "HIL." In addition, the emitting layer 144 includes red (R), green (G), and blue (B) sub-emitting layers. In each example, the emitting layer 144 is disposed in each pixel region "P."

For example, the buffer layer 146 is selected from one of an organic monomolecular material and an oxide, wherein the organic monomolecular material has a crystallinity and the oxide includes vanadium pentoxide ($V_2O_5$). The organic monomolecular material includes copper phthalocyanine (CuPc).

Next, the anode 148 is formed by depositing and patterning a transparent conductive material such as indium tin oxide (ITO) or indium zinc oxide (IZO) on the buffer layer 146. Thus, through the above-noted processes, the top emission type organic ELD is manufactured.

In addition, the OELD according to the present invention is an inverted structure such that a cathode of an opaque material is disposed as a lower electrode and an anode of a transparent conductive material is disposed as an upper electrode to form a top emission type OELD, thereby obtaining an improved aperture ratio without affecting the design of the array element. Further, the switching and driving elements are negative types, thereby reducing a number of processes, product cost, and increasing the stability of the circuit. More particularly, a defect where the emitting layer is excessively thinly deposited or is not deposited in a step difference on the array element can be prevented. Therefore, the effect of thermallization of the emitting layer and shorting between electrodes may be prevented by forming the planarization layer between the first passivation layer and the cathode.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an organic electroluminescent device, comprising:
    forming a gate line and a power line spaced apart from each other on a substrate;
    forming a gate insulating layer on the gate line and the power line;
    forming a data line on the gate insulating layer, the data line crossing the gate line;
    forming a switching element connected to the gate and data line, and a driving element connected to the switching element on the substrate including a pixel region, the switching element including a first gate electrode, a first semiconductor layer, a first source electrode, and a first drain electrode, the driving element including a second gate electrode, a second semiconductor layer, a second source electrode, and a second drain electrode;
    forming a planarization layer on the switching element and the driving element, the planarization layer having a substantially flat top surface;
    etching the planarization layer to form a drain contact hole that exposes a portion of the second drain electrode;
    forming a first passivation layer of an inorganic insulating material between the switching element and the planarization layer and between the driving element and the planarization layer;
    forming a cathode on the planarization layer, the cathode connected to the second drain electrode via the drain contact hole;
    forming an emitting layer on the cathode;
    forming an anode on the emitting layer; and
    forming an electron injection layer on the cathode, forming an electron transport layer on the electron injection layer, forming an emitting layer on the electron transport layer, forming a hole transport layer on the emitting layer, forming a hole injection layer on the hole transport layer, forming a buffer layer on the hole injection layer, and forming an anode on the buffer layer, wherein the cathode, the electron injection layer, the electron transport layer, the emitting layer, the hole transport layer, the hole injection layer, the buffer layer, and the anode are sequentially formed.

2. The method according to claim 1, wherein the first passivation layer is simultaneously etched with the planarization layer to form the drain contact hole.

3. The method according to claim 1, further comprising forming a second passivation layer between the cathode and the emitting layer, and etching the second passivation layer to open a main portion of the cathode.

* * * * *